United States Patent [19]
Funaki et al.

[11] Patent Number: 6,150,702
[45] Date of Patent: Nov. 21, 2000

[54] LATERAL HIGH-VOLTAGE SEMICONDUCTOR DEVICE HAVING AN OUTWARDLY EXTENDED ELECTRODE

[75] Inventors: Hideyuki Funaki, Tokyo; Akio Nakagawa, Hiratsuka; Fumito Suzuki, Kawasaki, all of Japan

[73] Assignee: Kabushiki Kaisha Toshiba, Kawasaki, Japan

[21] Appl. No.: 09/340,721

[22] Filed: Jun. 29, 1999

[30] Foreign Application Priority Data

Jun. 30, 1998 [JP] Japan .................................. 10-199521

[51] Int. Cl.$^7$ .................................................. H01L 23/58
[52] U.S. Cl. .......................... 257/409; 257/367; 257/490
[58] Field of Search .................................... 257/409, 367, 257/488–493; 438/140, 454

[56] References Cited

FOREIGN PATENT DOCUMENTS 6-077470  3/1994  Japan .
7-326775 12/1995  Japan .

*Primary Examiner*—David Hardy
*Attorney, Agent, or Firm*—Oblon, Spivak, McClelland, Maier & Neustadt, P.C.

[57] ABSTRACT

The breakdown strength of a lateral diode using a field plate is improved. There are provided a track-like first field plate connected to an anode electrode, a track-like second field plate formed outside the first field plate and connected to a cathode electrode, track-like third field plates provided concentrically between the first and second field plates, and fourth field plates provided so as to cross the first to third field plates and connected to each of them. The fourth field plates are so positioned that they allow more current to flow in the corner sections and under the electrodes where an electric field is liable to concentrate.

20 Claims, 3 Drawing Sheets

LATERAL HIGH-VOLTAGE SEMICONDUCTOR DEVICE HAVING AN OUTWARDLY EXTENDED ELECTRODE

BACKGROUND OF THE INVENTION

This invention relates to a high-voltage semiconductor device, and more particularly to a lateral high-voltage semiconductor device with high breakdown strength at the corners of the field plates.

In conventional high-voltage semiconductor elements used for power ICs, electrodes are provided in the same plane. To form an IC by connecting each element, the electrodes have to be connected to one another.

In general, a field plate is provided in an area between the high-voltage section and the low-voltage section via a field oxide film to alleviate the electric field at the surface of the semiconductor device.

A thick field oxide film is required to achieve high breakdown strength. The thick field oxide film makes the processing very difficult and the breakdown strength may be deteriorated due to a reliability test.

To overcome the problems, a method has been tried. In the method, a high-resistance film, such as an SIPOS film, is used to produce a uniform electric field in the lateral direction of the field oxide film. Leakage current is allowed to flow over the film. Use of such a high-resistance film, however, causes a rise in the cost and a reliability problem.

To avoid the problems, another method has been considered. In the method, a high-resistance silicon film is used as a field plate and made as narrow as possible. The narrow film connects the anode and cathode of each element. FIG. 6 is a plan view of a conventional high-voltage semiconductor device using this type of field plate. FIG. 7 is a sectional view taken along line VII—VII of FIG. 6. FIGS. 6 and 7 show a lateral diode as an example of high-voltage semiconductor device.

In the figures, numeral "1" indicates a substrate, "2" indicates an $SiO_2$ film, "3" indicates a high-resistance n-type cathode layer formed in a silicon substrate (SOI). At the surface of the n-type cathode layer 3, a p-type anode layer 4 and an n-type cathode layer 5 are selectively formed. At the surfaces of the p-type anode layer 4 and n-type cathode layer 5, a high-impurity-concentration p-type contact layer 6 and a high-impurity-concentration n-type contact layer 7 are selectively formed, respectively.

On the surface of the n-type cathode layer 3 in the area between the p-type anode layer 4 and the n-type cathode layer 5, a LOCOS oxide film 8 is formed. On the LOCOS oxide film 8, a spiral field plate 9 composed of a polysilicon film is formed.

The field plate 9 is composed of a track-like first field plate $9_1$ connected to an anode electrode 10, a track-like second field plate $9_2$ which is surrounded by the first field plate $9_1$ and is connected to a cathode electrode 11, and a spiral field plate 9a one end of which is connected to the first field plate $9_1$ and the other end of which is connected to the second field plate $9_2$. Numeral "12" indicates an interlayer insulating film.

To produce a uniform electric field needed to alleviate the electric field, the spiral pitch of the field plate 9a is set narrow. When the element width W becomes greater and the total length of the field plate 9 becomes larger, leakage current decreases in the field plate 9. If spiral field plate 9a is particularly narrow, almost no leakage current flows. As a result, it is difficult to maintain the uniform electric field, degrading the breakdown strength.

In a lateral semiconductor device having the above-mentioned structure, the electrodes connected to the semiconductor region in the central portion of the device are provided in such a manner that they cross the other regions. Because of the effect of an electric field caused by the currents flowing through the electrodes, a breakdown is liable to take place at and near the electrodes, which is a problem peculiar to the lateral semiconductor element.

BRIEF SUMMARY OF THE INVENTION

The object of the present invention is to provide a lateral high-voltage semiconductor device with a field plate capable of suppressing the degradation of breakdown strength even when the width of high-voltage semiconductor elements becomes greater and capable of alleviating the effect of an electric field caused by the electrodes.

According to a first aspect of the present invention, there is provided a lateral high-voltage semiconductor device comprising a first semiconductor region; a second semiconductor region; a field plate arranged between the first semiconductor region and the second semiconductor regions; a first electrode being connected to the first semiconductor region, and being arranged in a manner such that the first electrode crosses over the field plate and extends outwardly; a second electrode connected to the second semiconductor region; and a first current path located below the first electrode and connected to the field plate in a manner such that the first current path crosses the field plate.

According to a second aspect of the present invention, there is provided a lateral high-voltage semiconductor device comprising: a semiconductor substrate; a first conductivity-type semiconductor region selectively formed at the surface of the semiconductor substrate; a second conductivity-type semiconductor region being selectively formed at the surface of the semiconductor substrate; a field insulating film being provided on the semiconductor substrate to be located between the first conductivity-type semiconductor region and the second conductivity-type semiconductor region; a first field plate being provided on the field insulating film so as to surround the first conductivity-type semiconductor region, the first field plate being electrically connected to the first conductivity-type semiconductor region; a second field plate being provided on the field insulating film, and being electrically connected to the second conductivity-type semiconductor region; at least one third field plate being provided concentrically on the field insulating film, the at least one third field plate being arranged between the first field plate and the second field plate; at least one fourth field plate for connecting the first field plate, the third field plates, and the second field plate; and an electrode being connected to the first conductivity-type semiconductor region, the electrode extending outwardly in such a manner that the electrode crosses over the first, second, third, and fourth field plates, wherein the fourth field plate is located below the electrode.

According to a third aspect of the present invention, there is provided a lateral high-voltage semiconductor device having a first conductive region, a second conductive region surrounding the first conductive region, a field plate interposed between the first and second conductive regions, and an electrode extended outwardly from the first conductive region over the field plate, the field plate comprising: at least one first electric field generating element located at the corner section of the field plate; at least one second electric field generating element which is connected to the first electric field generating element and has a resistance higher than the first electric field generating element; and at least one current supply path for supplying current to the first electric field generating element and the second electric field generating element.

According to the present invention, the use of band-like field plates enables the degradation of breakdown strength to be suppressed without decreasing the current flowing in the field plate, even when the high-voltage semiconductor element has a wide width.

Furthermore, according to the present invention, the degradation of breakdown strength is further suppressed by connecting the field plates so as to allow more current to flow below the electrodes and around the corner sections where a breakdown is likely to take place.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

(First Embodiment)

Figure 1:
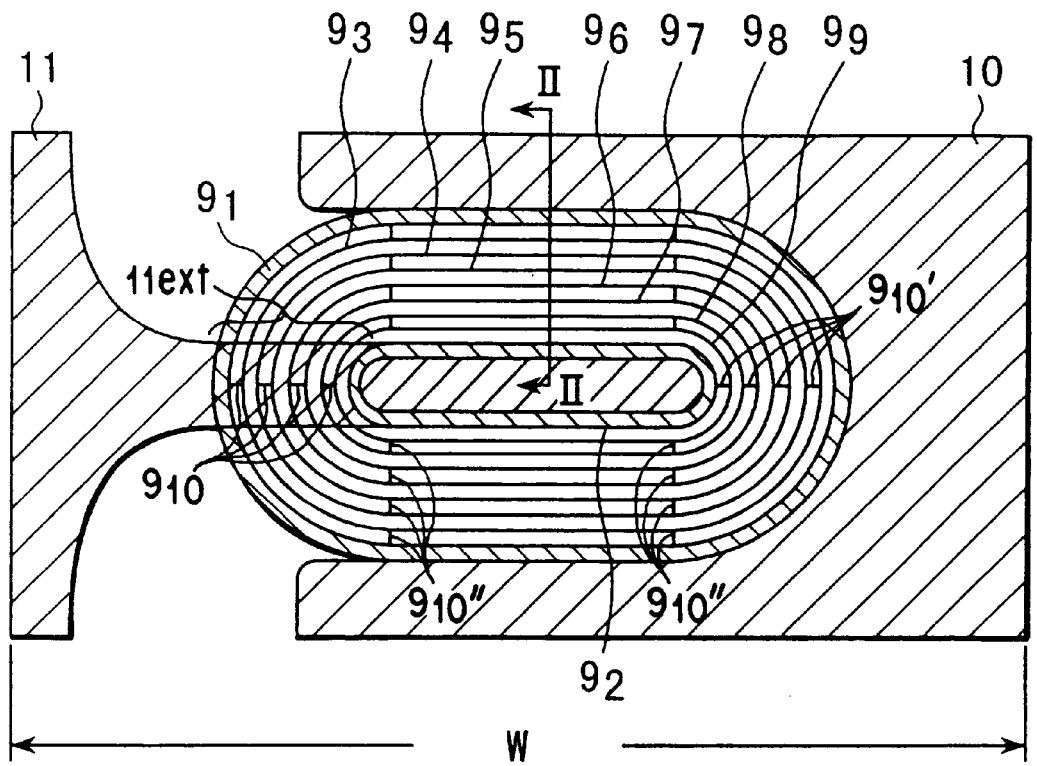
FIG. 1 is a plan view of a high-voltage semiconductor device according to a first embodiment of the present invention.

FIG. 1 is a plan view of a high-voltage semiconductor device according to a first embodiment of the present invention.

Figure 2:
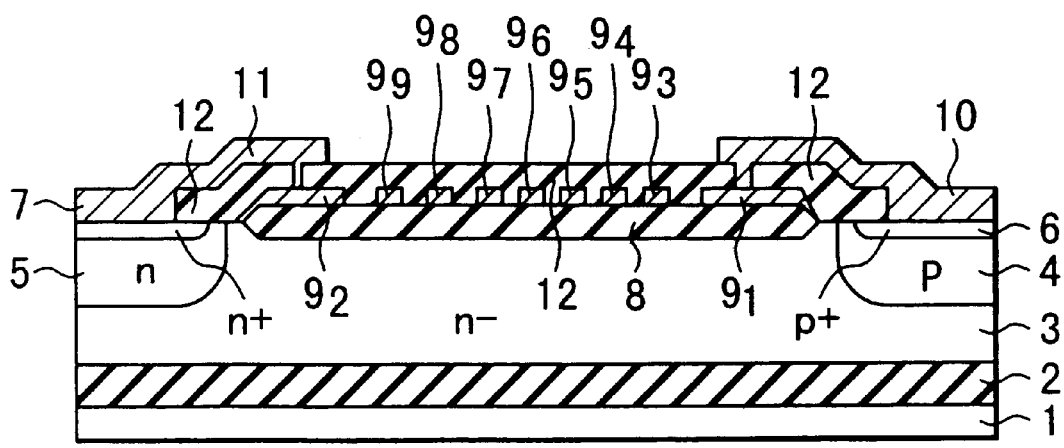
FIG. 2 is a sectional view taken along line II—II of FIG. 1.

FIG. 1 shows an example of using a lateral diode as a high-voltage semiconductor element. FIG. 2 is a sectional view taken along line II—II of FIG. 1.

In the first embodiment, a field plate 9 is composed of a track-like first field plate $9_1$ connected to an anode electrode 10, a track-like second field plate $9_2$ which is surrounded by the first field plate $9_1$ and is connected to a cathode electrode 11, track-like field plates $9_1$ to $9_9$ arranged concentrically at regular intervals between the first and second field plates $9_1$ and $9_2$, and linear field plates $9_{10}$ connecting adjacent plates $9_1$ to $9_9$. The field plates $9_{10}$ connect the adjacent ones of field plates $9_1$ to $9_9$ in one place at their corner sections and in two places at their straight-line sections.

The linear field plates $9_{10}$ connect the adjacent ones of field plates $9_1$ to $9_9$ to allow a large current to flow in the corner sections of the plates $9_1$ to $9_9$ located below the extended portion $11_{ext}$ (lead-out electrode) of the cathode electrode 11, in other words, to allow a large current to flow the portion of the field plates $9_1$ to $9_9$ located above the region where an electric field is liable to concentrate. The field plates $9_1$ to $9_9$ may be connected in the same manner at the other corner sections, for example, by using field plates $9_{10'}$ and/or field plates $9_{10''}$.

Regarding the first embodiment, the total length of the current path consisting of field plates $9_1$ to $9_9$ and linear field plates $9_{10}$ at the corner section is shorter than that at the straight section. Under the condition that those field plates are designed to have the same electric resistivity, e.g., the same width and thickness, the current path at the corner section has a resistance smaller than the current path at the straight section. Because of the resistance difference, the current flowing in the corner sections of the plates $9_1$ to $9_9$ above the region where an electric field is liable to concentrate increases, a leakage current having a sufficient amount to produce the field plate effect is allowed to flow in the corner sections, even when the greater element width W makes the total length of the field plate 9 larger. This makes it possible to produce a uniform electric field in the corner sections even when the width W of the elements becomes greater, suppressing the degradation of the breakdown strength. Furthermore, when the element width W remains unchanged, the breakdown strength can be increased.

(Second Embodiment)

Figure 3:
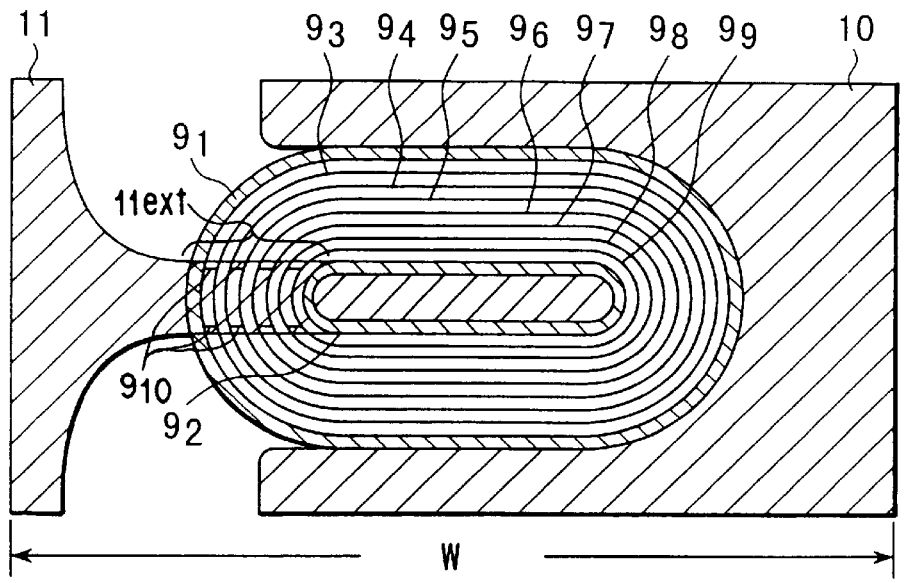
FIG. 3 is a plan view of a high-voltage semiconductor device according to a second embodiment of the present invention.

FIG. 3 is a plan view of a high-voltage semiconductor device according to a second embodiment of the present invention. The same parts as those in the first embodiment are indicated by the same reference symbols and detailed explanation of them is omitted.

The second embodiment differs from the first embodiment in that the adjacent field plates $9_1$ to $9_9$ are connected by linear field plates $9_{10}$ in a zigzag manner only under the extended portion $11_{ext}$ (lead-out electrode) of the cathode electrode 11.

With the second embodiment, the current flowing in the corner sections of the field plates $9_1$ to $9_9$ near the cathode electrode 11 further increases, whereas the current flowing in the straight line sections further decreases. Consequently, if the leakage current flowing in the field plate 9 remains unchanged, the breakdown strength in the corner sections of the cathode electrode 11 will increase more than in the first embodiment.

(Third Embodiment)

Figure 4:
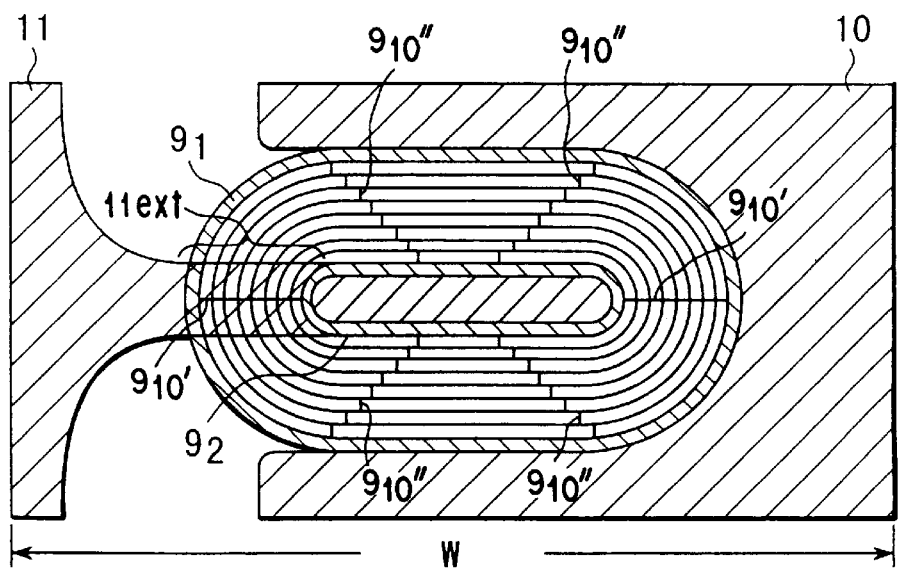
FIG. 4 is a plan view of a high-voltage semiconductor device according to a third embodiment of the present invention.

FIG. 4 is a plan view of a high-voltage semiconductor device according to a third embodiment of the present invention. The same parts as those in the first embodiment are indicated by the same reference symbols and detailed explanation of them will not be given.

The third embodiment has a feature that the portions of field plates $9_1$ to $9_9$ located below the extended portion llext (lead-out electrode) of the cathode electrode 11 are connected by linear field plates $9_{10}$ arranged linearly. The field plates $9_1$ to $9_9$ may be connected at the opposite side by another linear field plate $9_{10'}$. Further, the field plates $9_1$ to $9_9$ may be connected at the straight section, for example in a manner as shown in FIG. 4, where field plates $9_1$ to $9_9$ are connected by four linear field plates $9_{10''}$ in a zigzag manner.

If high-resistance polysilicon films, for example, narrow polysilicon films, are used as the field plate $9_{10'}$, the breakdown strength at the corner section can be improved reliably without increasing the leakage current.

As long as the value of the leakage current (the one drawn by the field plate 9 from the current originally to flow in the elements) in the first to third embodiments is of the order of microamperes, there is no problem.

The present invention is not limited to the above embodiments. For instance, in the above embodiments, the lateral diode has been used, the invention may be applied to other lateral power semiconductor elements, including lateral power MOS transistors and lateral IGBTs.

Figure 5:
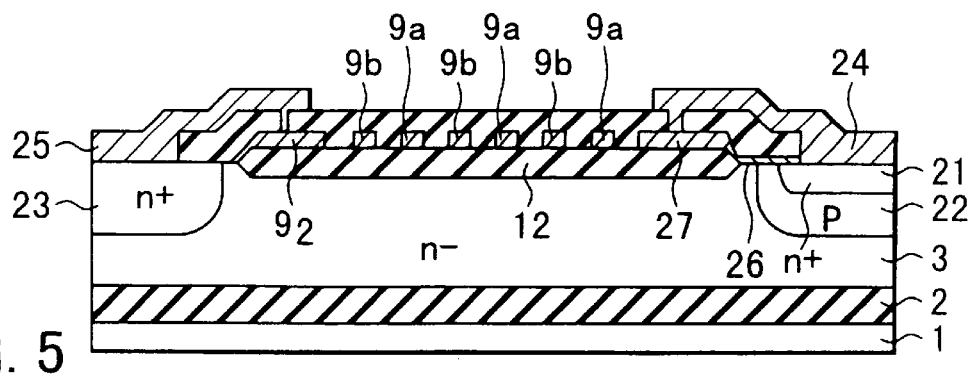
FIG. 5 is a plan view of a high-voltage semiconductor device according to a modification of the present invention.
Figure 6:
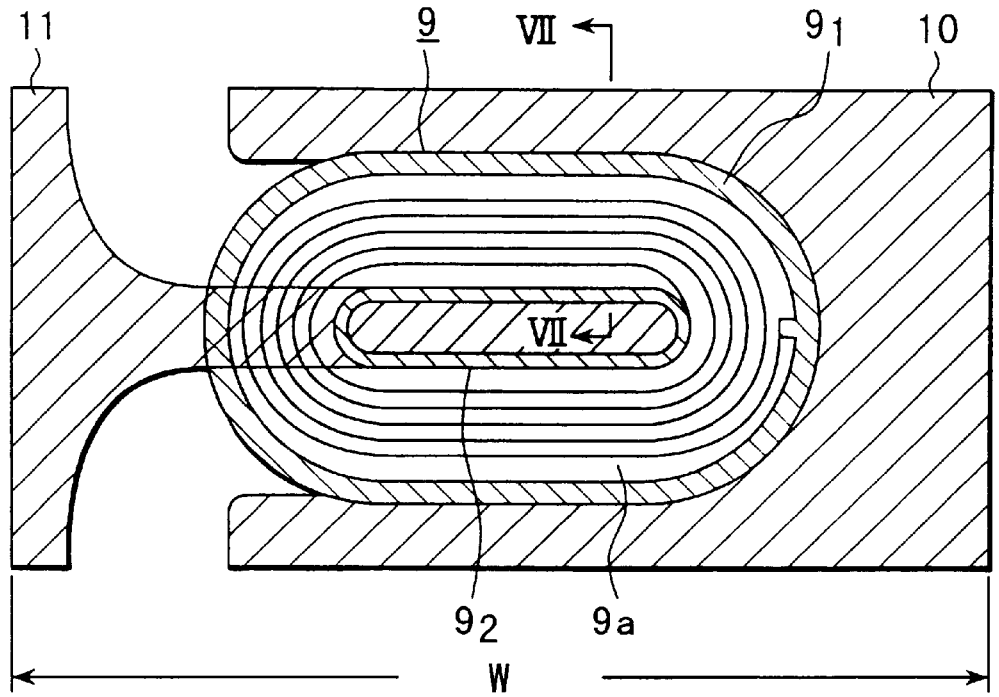
FIG. 6 is a plan view of a conventional high-voltage semiconductor device.
Figure 7:
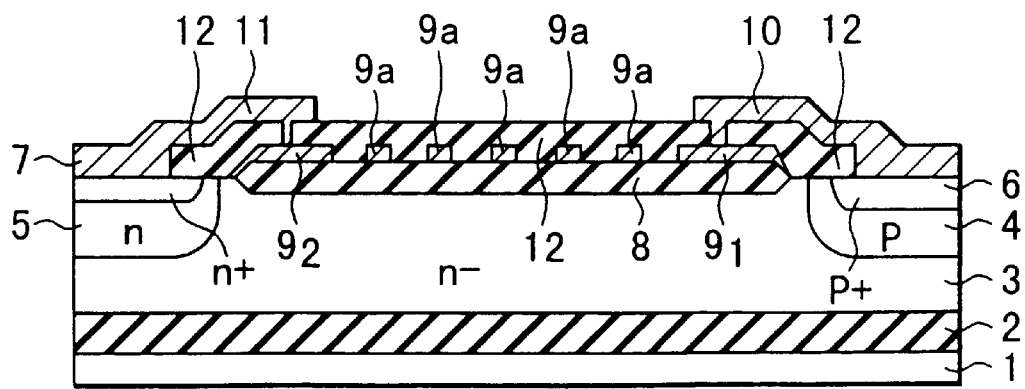
FIG. 7 is a sectional view taken along line VII—VII of FIG. 6.

FIG. 5 is a sectional view of a lateral power MOS transistor to which the present invention has been applied. In FIG. 5, numeral "21" indicates a high-impurity-concentration n-type source layer, "22" indicates a p-type well layer, "23" indicates a high-impurity-concentration n-type drain layer, "24" indicates a source electrode, "25" indicates a drain electrode, "26" indicates a gate oxide film, and "27" indicates a gate electrode. When the invention is applied to an IGBT, the n-type drain layer 23 has to be replaced with a p-type drain layer. While in FIG. 5, the field plate structure of the first embodiment has been used, the field plate structure of the other embodiments may be applied.

While in the above embodiments, the SOI substrate has been used, other semiconductor substrate may be used. For the SOI substrate, the one formed by a direct adhesion method should be used.

The present invention may be practiced or embodied in still other ways without departing from the spirit or essential character thereof.

Regarding the present invention, field plates $9_{10}$, $9_{10'}$, and $9_{10''}$, connect the individual track-like field plates one another to reduce the resistance of the current path above the region where an electric field is liable to concentrate. This enables a uniform electric field to be generated in the region where an electric field is liable to concentrate even when the element has a large width, which prevents the breakdown strength from deteriorating.

Furthermore, in the invention, field plates $9_{10}$ are provided to allow more current to flow below the electrode and in the corner section where a breakdown is liable to take place. This further suppresses the degradation of the breakdown strength above the region where an electric field is liable to take place.

The present invention is particularly useful for a lateral semiconductor device with electrodes crossing the field plates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lateral high-voltage semiconductor device comprising:
   a first semiconductor region;
   a second semiconductor region;
   a field plate arranged between said first semiconductor region and said second semiconductor regions;
   a first electrode being connected to said first semiconductor region, and being arranged in a manner such that said first electrode crosses over said field plate and extends outwardly;
   a second electrode connected to said second semiconductor region; and
   a first current path located below said first electrode and connected to said field plate in a manner such that said first current path crosses said field plate.

2. The lateral high-voltage semiconductor device according to claim 1, wherein said field plate has at least one band-like conductor being arranged to surround said first semiconductor region, said at least one band-like conductor being connected to said first electrode and said second electrode through said first current path.

3. The lateral high-voltage semiconductor device according to claim 2, wherein said at least one band-like conductor includes at least one ringed conductor arranged concentrically with said first semiconductor region in the center.

4. The lateral high-voltage semiconductor device according to claim 3, wherein said first current path comprises at least one conductive line for connecting said at least one ringed conductor to said first electrode, and said second electrode.

5. The lateral high-voltage semiconductor device according to claim 4, wherein said at least one conductive line is provided in the form of a straight line.

6. A lateral high-voltage semiconductor device according to claim 4, wherein said at least one conductive line is provided zigzag.

7. The lateral high-voltage semiconductor device according to claim 4, wherein said ringed conductor and said conductive line are made of a polysilicon film.

8. The lateral high-voltage semiconductor device according to claim 1, further comprising at least one second current path for connecting said field plate to said first electrode and said second electrode, said at least one second current path being arranged to cross said field plate.

9. The lateral high-voltage semiconductor device according to claim 8, wherein said field plate is divided by said first current path and said second current path into a first subfield plate including the corner section and a second subfield plate adjoining said first subfield plate and having a higher resistance than said first subfield plate.

10. The lateral high-voltage semiconductor device according to claim 9, wherein said first subfield plate is shorter in length than said second subfield plate.

11. A lateral high-voltage semiconductor device comprising:
   a semiconductor substrate;
   a first conductivity-type semiconductor region selectively formed at the surface of said semiconductor substrate;
   a second conductivity-type semiconductor region being selectively formed at the surface of said semiconductor substrate;
   a field insulating film being provided on said semiconductor substrate to be located between said first conductivity-type semiconductor region and said second conductivity-type semiconductor region;
   a first field plate being provided on said field insulating film so as to surround said first conductivity-type semiconductor region, said first field plate being electrically connected to said first conductivity-type semiconductor region;

a second field plate being provided on said field insulating film, and being electrically connected to said second conductivity-type semiconductor region;

at least one third field plate being provided concentrically on said field insulating film, said at least one third field plate being arranged between said first field plate and said second field plate;

at least one fourth field plate for connecting said first field plate, said third field plates, and said second field plate to one another; and an electrode being connected to said first conductivity-type semiconductor region, said electrode extending outwardly in such a manner that said electrode crosses over said first, second, third, and fourth field plates, wherein said fourth field plate is located below said electrode.

12. The lateral high-voltage semiconductor device according to claim 11, wherein said fourth field plate comprises at least one conductive film for connecting said first field plate, third field plates, and second field plate to one another.

13. The lateral high-voltage semiconductor device according to claim 12, wherein said conductive film is arranged linearly along said electrode.

14. The lateral high-voltage semiconductor device according to claim 12, wherein said conductive film is provided zigzag in the longitudinal direction of said electrode.

15. The lateral high-voltage semiconductor device according to claim 12, further comprising at least one fifth field plate being arranged to cross said third field plate, said fifth field plate connecting a part of said third field plate to said first field plate and connecting another part of said third field plate to said second field plate.

16. The lateral high-voltage semiconductor device according to claim 15, wherein said third field plate are divided by said fourth and fifth field plates into a first subfield plate of an arc shape including corner sections and a second subfield plate of a straight line adjoining said first subfield plates and having a higher resistance than said first subfield plates.

17. The lateral high-voltage semiconductor device according to claim 16, wherein said first subfield plates are shorter in length than said second subfield plates.

18. A lateral high-voltage semiconductor device having a first conductive region, a second conductive region surrounding the first conductive region, a field plate interposed between the first and second conductive regions, and an electrode extended outwardly from the first conductive region over the field plate, said field plate comprising:

at least one first electric field generating element located at the corner section of said field plate;

at least one second electric field generating element which is connected to said first electric field generating element and has a resistance higher than said first electric field generating element; and at least one current supply path for supplying current to said first electric field generating element and said second electric field generating element.

19. The lateral high-voltage semiconductor device according to claim 18, wherein at least one of said first electric field generating element is provided below said electrode.

20. The lateral high-voltage semiconductor device according to claim 19, wherein said current supply path is provided in such a manner that the current flowing through said first electric field generating element is greater than the current flowing through said second electric field generating element.

* * * * *